(12) United States Patent
Illsley et al.

(10) Patent No.: US 6,296,986 B1
(45) Date of Patent: *Oct. 2, 2001

(54) PHOTOINITIATOR

(75) Inventors: Derek Ronald Illsley, Brookmead Way; Aylvin Angelo Dias, Shortlands; Robert Stephen Davidson, Leicester; Roger Edward Burrows, Canterbury, all of (GB)

(73) Assignee: Coates Brothers PLC (GB)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/068,288

(22) PCT Filed: Nov. 6, 1996

(86) PCT No.: PCT/GB96/02714

§ 371 Date: Nov. 10, 1998

§ 102(e) Date: Nov. 10, 1998

(87) PCT Pub. No.: WO97/17378

PCT Pub. Date: May 15, 1997

(30) Foreign Application Priority Data

Nov. 6, 1995 (GB) .................................................. 9522683

(51) Int. Cl.[7] ........................................................ G03F 7/027
(52) U.S. Cl. ........................... 430/281.1; 522/33; 522/34; 522/36; 522/46; 522/96
(58) Field of Search ........................... 430/281.1; 522/34, 522/65, 33, 36, 46, 96

(56) References Cited

U.S. PATENT DOCUMENTS

| | | | |
|---|---|---|---|
| 3,429,852 | * | 2/1969 | Skoultchi ................................ 260/47 |
| 5,047,556 | * | 9/1991 | Kohler et al. ........................... 549/27 |
| 5,506,279 | * | 4/1996 | Babu et al. ............................. 522/34 |
| 5,527,925 | * | 6/1996 | Chabrecek et al. ................... 549/430 |
| 5,532,112 | * | 7/1996 | Kohler et al. ...................... 430/281.1 |
| 5,543,262 | * | 8/1996 | Sypek et al. ........................... 430/162 |
| 5,859,084 | * | 1/1999 | Schroder et al. ....................... 522/34 |

FOREIGN PATENT DOCUMENTS

| | | |
|---|---|---|
| 66039/94 | 2/1995 | (AU) . |
| 0281941 | 9/1988 | (EP) . |
| 0341560 | 11/1989 | (EP) . |
| 0632329 | 12/1997 | (EP) . |
| 1002212 | 8/1965 | (GB) . |
| 2280905 | 2/1995 | (GB) . |
| 62-63811 | 9/1994 | (JP) . |
| 62-63812 | 9/1994 | (JP) . |
| 62-63813 | 9/1994 | (JP) . |
| 62-63814 | 9/1994 | (JP) . |
| WO97/07161 | 2/1997 | (WO) . |

OTHER PUBLICATIONS

S.P. Pappas; "UV Curing: Science and Technology"; vol. II; Technology Marketing Corporation; 1985; pp. 3–13.

H.J. Hageman; Photoinitiators and photoinitiation mechanisms of free–radical polymerisation processes. Chapter One in "Photopolymerisation and Photoimaging Science and Technology"; Elsevier; 1989; pp. 1–53.

K. Dietliker; "Chemistry & Technology of UV & EB Formulation for Coatings, Inks & Paints"; vol. III; Photoinitiators for Free Radical and Cationic Polymerisation; Selective Industrial Training Associates Limited 1991; various pages.

* cited by examiner

*Primary Examiner*—Rosemary E. Ashton
(74) *Attorney, Agent, or Firm*—Ostrolenk, Faber, Gerb & Soffen, LLP

(57) ABSTRACT

A multifunctional photoinitiator is obtainable as the reaction product of a multifunctional core material containing two or more reactive groups and a photoinitiator or a derivative thereof. The photoinitiator or its derivative has a reactive group capable of reacting with the reactive groups of the multifunctional core.

10 Claims, No Drawings

PHOTOINITIATOR

The present invention relates to a photoinitiator for curable compositions and in particular, for photo-curable coating compositions.

Such compositions are any which are cured by exposure to ultraviolet light and include for example, lacquers which may be applied to wood, metal or similar substrates by suitable techniques such as roll coating or curtain coating. They may also be formulated as inks, for example to be applied by techniques such as letterpress, offset lithography, rotogravure printing, silk screen printing or flexographic printing. Printing, depending on the particular printing technique, is applicable to a wide range of substrates which include paper, board, glass, plastics materials or metals.

There is an increasing appreciation of a need to minimise migration and/or extraction of residual photoinitiator components from the cured product. For example, inks used in printing on plastics food packaging should ideally meet the stringent standards for minimisation of extractables from the coated and/or printed plastics. Such contamination can cause problems of taint and odour of the foodstuff. Moreover, for other coating compositions, it is important to minimise migration of reactive materials which may cause other undesirable effects such as loss of adhesion to the substrate, yellowing, or other undesirable effects.

One approach to reduce the concentration of residual photoinitiator components in the cured product and hence migratables and/or extractables is to use photoinitiators which contain an ethylenically unsaturated moiety, for example, 4(2-acryloyloxyethoxy)-phenyl-(2-hydroxy-2-propyl) ketone as described in U.S. Pat. No. 4,922 004. The ethylenically unsaturated group enables the photointiator to become incorporated into the polymeric structure, during the curing process.

An alternative approach is to use photoinitiators of increased molecular size to reduce the level of migratable and/or extractable residual photoinitiator components in a cured coating or ink composition. Such polymeric photoinitiators are disclosed in EP-A-0 161 463 and include a commercially available compound, Fratelli-Lamberti's KIP 100. Examples of polymeric benzophenones have also been described (C. Carlini et. al., Polymer 24, 599 (1983)). It is possible to combine the advantages of greater molecular size and ethylenic unsaturation in the same compound by incorporating a photoinitiator moiety into an ethylenically unsaturated vehicle such as a urethane acrylate, as disclosed in GB-A-2 280 905.

The present invention is aimed at providing multifunctional photoinitiators (i.e. photoinitiators which are multifunctional with respect to photoactive groups) with reduced levels of migratable and/or extractable residual photoinitiator components, compared with monofunctional photoinitiators.

Thus the present invention provides a multifunctional photoinitiator which is obtainable as the reaction product of a multifunctional core material containing two or more reactive groups and a photoinitiator or a derivative thereof, which photoinitiator or its derivative has a reactive group capable of reacting with said reactive groups of the multifunctional core.

Although not wishing to be bound by any particular theory or explanation, the applicants have conjectured that the advantage over known monofunctional photoinitiators is a consequence of the increased likelihood of any particular photoinitiator molecule initiating the polymerisation of ethylenically unsaturated materials. Thus, any multifunctional photoinitiator molecule will have an increased probability of becoming bound into a cured coating, resulting in reduced levels of migratable and/or extractable photoinitiator components from the cured coating.

The multifunctional photoinitiators of the present invention preferably have a relatively small "core" between the functional groups, preferably so that the average percentage molecular weight of functional groups per total molecular weight of the multi-functional photoinitiator is at least 30%, more preferably at least 40%. A difunctional photoinitiator according to the present invention should preferably have a core having a molecular weight less than 500. The core of a tetrafunctional photoinitiator according to the invention should preferably have a core having molecular weight less than 1000 and a hexafunctional photoinitiator according to the invention should preferably have a core having a molecular weight less than 1500.

A preferred embodiment of a photoinitiator according to the present invention comprises a multifunctional photoinitiator which is obtainable as the reaction product of a multifunctional core material containing two or more reactive groups and a photoinitiator or a derivative thereof, which photoinitiator or its derivative has a reactive group capable of reacting with said reactive groups of the multifunctional core.

Multifunctional photoinitiators according to the present invention not only show good photoinitiating properties but in addition, possess one or more advantages over the photoinitiators described in U.S. Pat. No. 4,922,004 or EP-A-0 161 463. For example, compared to the ethylenically unsaturated materials, or indeed compared with any monofunctional material they result in cured compositions having higher molecular weights and increased hardness. This is attributable to their polyfunctional nature.

Compared with polymeric photoinitiators, such as those disclosed in EP-A-0 161 463, examples of the present invention give significantly lower viscosity compositions due to their more highly branched nature resulting from the attachment of a suitably reactive photoinitiator to a compact, multifunctional reactive core. This gives a viscosity advantage over the polymeric multifunctional materials which is very beneficial in many applications, for example flexographic printing, because it makes the compositions more easy to apply and endows them with better wetting capabilities etc. Moreover, this low viscosity means that less diluent is required in the compositions, which also minimises migration of components from the cured product.

The multifunctional photoinitiators of the present invention also meet the primary aim of minimizing migration of the photoinitiators themselves, from the finally cured composition.

Some commercially available photoinitiators themselves have a reactive group capable of reacting with suitable reactive groups on a multifunctional core material. For example, the ethylenically unsaturated materials described in U.S. Pat. No. 4,922,004 can advantageously react with multifunctional amines. However, in some cases, it may be necessary first to modify a commercially available photoinitiator to endow it with a reactive group capable of reacting with the reactive groups of the multifunctional core materials.

One preferred class of material according to the present invention comprises those materials which are obtainable by reaction of a photoinitiator having an ethylenically unsaturated group together with a multifunctional amine, for example a tetrafunctional photoinitiator can be prepared by the action of 4-(2-acryloyloxyethoxy)-phenyl-(2-hydroxy-2- propyl)-ketone on 1,4-diaminobutane (Michael addition of amine to ethylenic unsaturation).

Other suitable polyfunctional amines include N,N'-dimethylethylenediamine which will result in a difunctional material; hexylamine which, again, will produce a difunctional material; ethylenediamine which will produce a tetrafunctional material; 1,4-diaminobutane which will result in a tetrafunctional material; and N,N'-bis(3-aminopropyl) ethylenediamine which produces a hexafunctional material.

In any event, Type I (i.e. cleavage-type) photoinitiators or Type II (hydrogen abstractive-type) photoinitiators may be used in their primary or modified form, depending on whether or not they are already capable of reacting with suitable reactive groups of the multifunctional core material.

Suitable Type I photoinitiators include any of those described in U.S. Pat. No. 4,922,004, those described in JP-A-89-230603, or the material disclosed in Carlini et al (C Carlini, L Angiolini, N Lelli, F Ciardelli, P A Rollini; FATIPEC-Kongr. 1990, 20th, p.413) namely α-methylolbenzoin methyl ether acrylate.

Yet again, the vinyl-functional hydroxyalkylphenone materials of Klos et al (R Klos, H Gruber, G Greber; J. Macromol. Sci. Chem., A28, 925 (1991)) may be used.

In fact, in principle, it is possible to acrylate any suitably reactive photoinitiator for use in a Michael addition reaction scheme. Suitably reactive photoinitiators can be obtained through acrylating α-hydroxymethylbenzoin and α-hydroxymethylbenzoin methyl ether. Any other hydroxy-functional photoinitiator can also be treated in the same way, e.g. (1-hydroxycyclohexyl acetophenone, hydroxyacetophenone, hydroxypropiophenone, benzoin).

Suitable Type II photoinitiators include those disclosed in Carlini et al (C Carlini, F Ciardelli, D Donati, R F Gurconi; Polymer, 24, 599 (1983)), namely 4-vinylbenzophenone and 4-acryloyloxybenzophenone.

An ethylenically reactive thioxanthone such as 2-acryloyloxythioxanthone may also be used.

It should be appreciated that a very wide range of mutually reactive groups are available for use as the respective reactive groups of the multifunctional core material and the photoinitiator or its derivative. For example, when one of these is an acid or acid anhydride group, the other may be selected from hydroxy groups, amine groups, epoxy groups and isocyanate groups.

Alternatively, when one is an acrylate or methacrylate group, the other may for example be selected from amine groups and thiol groups.

Yet again, if one is an amine group the other may be selected from acid groups, acid anhydride groups, acrylate groups, isocyanate groups and epoxy groups.

In the case of one of the aforementioned groups being a hydroxy group, the other may be selected from carbonyl derivatives, isocyanates, acids or acid anhydrides, acid halides and esters.

Some specific chemistries applicable to this include the reaction of 1,3,5-benzene tricarboxylic acid chloride with 4-(2-hydroxyethoxy) phenyl-(2-hydroxy 2-propyl) ketone.

Another suitable reaction scheme comprises the reaction of multi-hydroxy functional aromatic core material with brominated photoinitiators thus:

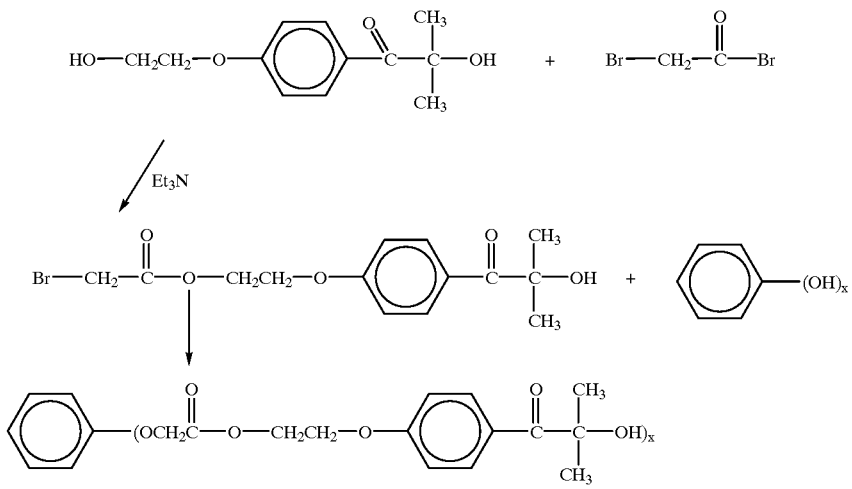

x=1 Phenol x=2 Resorcinol
   Bisphenol A
   Dihydroxybenzophenone x=3 Phloroglucinol x=4 Calixarene

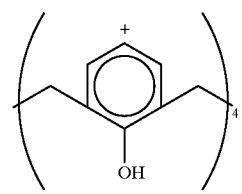

Yet other synthetic routes to producing multifunctional photoinitiators according to the present invention include:

1) Polyfunctional isocyanate+hydroxy/amine functional PI —(NCO)$_x$+x HO—PI or x H$_2$N—PI 2) Polyfunctional acid derivatives+hydroxy/amine functional PI

| Acid | —(COOH)$_x$ | |
|---|---|---|
| Acid chloride | —(COCl)$_x$ | + x HO—PI or xH$_2$N—PI |
| Ester | —(COOR)$_x$ | |
| Anhydride | —(COOOCR)$_x$ | |

3) Polyfunctional epoxy core+acid functional PI (hydroxy functional PI)

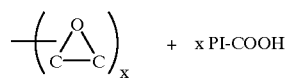 + x PI-COOH

PI = Photoinitiator

The preferred route to producing multifunctional photoinitiators according to the present invention, as well as many of the other chemistries described above, rely on polyfunctional amines. In principle, any of a very extensive range of such polyfunctional amines is suitable. The following non-limiting homologous series give some idea of the range of possibilities.

| Difunctional: | Butylamine |
| | Hexylamine |
| | Octylamine |
| | Decylamine |
| | etc. |
| Difunctional: | N,N'-dimethylethylenediamine |
| | N,N'-dimethylbutylenediamine |
| | N,N'-dimethylhexylenediamine |
| | etc. |
| Tetrafunctional: | Ethylenediamine |
| | 1,4-Diaminobutane |
| | 1,6-Diaminohexane |
| | etc. |
| Hexafunctional: | N,N'-Bis(2-aminoethyl)-1,3-propanediamine |
| | N,N'-Bis(3-aminopropyl)-1,4-butanediamine |
| | N,N'-Bis(3-aminopropyl)ethylenediamine |
| | N,N'-Bis(3-aminopropyl)-1,3-propanediamine |

Examples of photoinitiator materials containing a reactive hydroxyl group include 4-(2-hydroxyethoxy)-phenyl-2-(2-hydroxy)propyl ketone, (which is particularly preferred) p-hydroxybenzophenone, m-hydroxybenzophenone, hydroxyacetophenone and hydroxypropiophenone.

The invention will now be explained in more detail by way of the following non-limiting examples.

EXAMPLE A

Control Preparation of Monofunctional Photoinitiator

To 0.234 g (96×10$^{-3}$ mol) of N-methylethylamine dissolved in 1 ml of acetonitrile was slowly added 1.00 g (3.60×10$^{-3}$ mol) of 4-(2-acryloyloxyethoxy)-phenyl-(2-hydroxy)propyl ketone (Photoinitiator "X"). The reagents were stirred at room temperature under nitrogen until the reaction reached completion (4 h). The reaction was followed by TLC using a mixture of 80% ether and 20% hexane as the eluent. The product was isolated by evaporating off the solvent and the excess amine.

EXAMPLES 1–5

Using the amine starting materials specified, Examples 1–5 of polyfunctional photoinitiators according to the present invention were prepared in a manner analogous to that of Example A. Stoichiometric ratios, reaction conditions and purities are given for each of these Examples and also for Example A, in Table 1.

TABLE 1

| EXAMPLE | ADDUCT | AMINE | WT AMINE (g) | WT ACRYLATED[1] PI (g) (PHOTOINITIATOR "X") | STOICHIOMETRY[2] AMINE ACRYLATE | REACTION TIME[3] | PURITY[4] |
|---|---|---|---|---|---|---|---|
| A | Monoadduct | N-methylamine | 0.234 | 1.00 | 1.1:1 | 4 h | 95% |
| 1 | Diadduct | Dimethylethylenediamine | 0.381 | 2.00 | 1.2:1 | 4 h | 95% |
| 2 | | Hexylamine | 0.182 | 1.00 | 1:1 | 7 days | 95% |
| 3 | Tetraadduct | Ethylenediamine | 0.108 | 2.00 | 1:1 | 4 days | >90% |
| 4 | | 1,4-Diaminobutane | 0.079 | 1.00 | 1:1 | 4 days | >90% |
| 5 | Hexaadduct | N,N'-Bis(3-aminopropyl) Ethylenediamine | 0.106 | 1.00 | 1:1 | 7 days | 80% |

[1]Photoinitiator "X" is 4-(2-acryloyloxyethoxy)-phenyl-(2-hydroxy) propyl ketone
[2]The ratio of amine functional groups to acrylate groups of the photoinitiator
[3]Determined by TLC and GPC
[4]Determined by GPC Characterisation All the multifunctional photoinitiators were well characterised by:
(i) TLC
(ii) GPC
(iii) $^1$H nmr
(iv) FAB MS

EXAMPLE 6

3.00 g of 4-benzoyl benzoic acid (0.0133 moles) and 2.15g of N,N'-carbonyldiimidazole (0.0133 moles) were dissolved in 50 ml of THF and stirred for 3 hours. 0.56 g of phloroglucinol (0.0044 moles) was added to the other reactants and the resulting mixture was stirred for a fir ther 24 hours. The product was filtered and the solvent removed by evaporation The solid was dissolved in 50 ml of dichloromethane and washed with dilute hydrochloric acid (5×100 ml) and then with water (2×100 ml) and finally with dilute sodium hydroxide (3×100 ml). The organic layer was separated, dried, filtered and the solvent removed by evaporation. The crude residue was purified by column chromatography (silica gel) using an 80:20 mixture of ethyl acetate and petroleum ether as the eluting solvent.

EXAMPLE 7

1.00 g of benzenetricarbonyl trichloride (0.0038 moles) in 15 ml of freshly distilled THF was added to an ice-cold solution of 2.562 g of Darocur® 2959 (0.0114 moles) and 1.52 g of triethylamine in 5 ml of THF.

After 10 minutes, the reaction mixture was allowed to warm to room temperature and then stirred for 24 hours. The mixture was filtered and the solvent was removed by evaporation. The residue was dissolved in dichloromethane and washed with dilute hydrochloric acid (5×100 ml) and water (2×100 ml). The organic layer was separated and dried, and the solvent was subsequently removed. The product was purified in a similar fashion to that used for Example 6.

EXAMPLE 8

3.00 g of 4-benzoyl benzoic acid (0.0133 moles) and 2.30 g of N,N'-carbonyldiimidazole (0.0142 moles) were dissolved in 50 ml of THF and stirred for 3 hours. 0.66 g of triethanolamine (0.0044 moles) was added to the other reactants and allowed to react for a further 24 hours. The washing and purification procedures were the same as for Example 6.

EXAMPLE 9

2.00 g of azelaic acid (0.0106 moles) and 3.44 g of N,N'-carbonyldiimidazole (0.0213 moles) were dissolved in 50 ml of THF and the solution was then stirred for 3.5 hours. 4.77 g of Darocur® 2959 (0.0213 moles) were added to this solution and the mixture was stirred for 3 days. The solvent was removed by evaporation and the residue was dissolved in dichloromethane. The washing and purification procedures were similar to those described in Example 7.

EXAMPLE 10

7.00 g of 2-benzoyl benzoic acid (0.031 moles) was dissolved in 40 ml of THF along with 5.48 g of poly (bisphenol A-co-epichlorohydrin) (MW~355) (0.015 moles). The reaction mixture was heated under reflux for 7 hours in the presence of 0.30 g of tetramethyl ammonium bromide. The solvent was removed by evaporation and then the product was purified by column chromatography using the conditions outlined previously.

EXAMPLE 11

10.86 g (0.060 moles of isocyanate) of Desmodur® N3200, 13.89 g (0.062 moles) of Darocur® 2959 and 0.01 g of dibutyltindilaurate were dissolved in 100 g of dry methyl ethyl ketone. The reagents were refluxed, under nitrogen, for 6 hours. The solvent was subsequently removed by evaporation to leave the product.

EXAMPLE 12

Assessment of the Photoinitiating Activity of the Multifunctional Photoinitiators (By DPC)

The photoinitiating capacity of Photoinitiator "X" and examples A, 1, 4 and 5 was assessed using a Perkin Elmer DPA7, equipped with a 100 Watt Hg short arc lamp. The photoinitiators were made up as 0.2% (by weight) solutions in a 80:20 mixture of Craynor's CN934 (a urethane diacrylate) and TMPTA, and thermograms recorded at a cell temperature of 40° C. Prior to running each experiment, the DPC compartment was purged with nitrogen for 5 minutes so as to exclude oxygen and remove any problems due to inhibition.

The following table summarises the DPC results.

| Material | Functionality[1] | Heat Flow (W/g)[2] | Ratio of Exotherm Peak Heat to that of Photoinitiator "X"[3] |
|---|---|---|---|
| Photoinitiator "X" | Mono (polymerisable) | −21.5 | 1.0 |
| Example A | Mono | −20.5 | 1.05 |
| Example 1 | Di | −19.5 | 1.10 |
| Example 4 | Tetra | −19.5 | 1.10 |
| Example 5 | Hexa | −21 | 1.02 |

1 Each of the photoinitiators is described on the basis of the polyfunctional amine core.

2 The average heat flow during the course of the experiment.

3 The relative height of the exotherm peak is related to the initial rate of photopolymerisation.

The final extent of acrylate double bond conversion for all the photoinitiators was 71% (±1.0%).

Thus, from the above results, it is seen that the photoinitiating activity of the photoinitiator group is maintained.

EXAMPLE 13

Using the Multifunctional photoinitiators to Cure Lauryl Acrylate

Mixtures containing multifunctional photoinitiator in lauryl acrylate were prepared so that the concentration of photoactive groups was 1.04% (by weight). The mixtures were cured using a Primarc Minicure rig and the products analysed by GPC. The following materials were used:
i) Darocure 2959
ii) Example A
iii) Example 1
iv) Example 4

Photoinitiator "X" (4-(2-acryloyloxyethoxy)-phenyl-(2-hydroxy-2-propyl)ketone) was not used in this set of experiments owing to its bifunctional character, i.e. it contains both a photoinitiator group and an acrylate group.

The GPC results for the cured lauryl acrylate products are shown in Table 2. As the functionality of the multifunctional photoinitiator increases, the molecular weight of the polymeric product also increases (the time to peak height maxima decreases). Assuming that the likelihood of any photoinitiator group initiating photopolymerisation is the same for all the multifunctional photoinitiators, and that the polymerisation conditions are also the same, then the increase in MWs can be explained in terms of multi-initiation from the higher functional multifunctional photoinitiators. Multi-initiation from a photoinitiator molecule would increase its chance of becoming bound into a UV-curing network. Thus, it would be anticipated that the amount of photoinitiator extractables/migratables should be reduced. This is supported by the extraction results.

TABLE 2

| GPC RETENTION TIMES (CURED LAURYL ACRYLATE) | | |
|---|---|---|
| EXAMPLE | FUNCTIONALITY | RETENTION TIME/MINS |
| DAROCUR 2959 | MONOFUNCTIONAL | 25.0 |
| A | MONOFUNCTIONAL | 25.0 |

TABLE 2-continued

GPC RETENTION TIMES (CURED LAURYL ACRYLATE)

| EXAMPLE | FUNCTIONALITY | RETENTION TIME/MINS |
|---|---|---|
| 1 | DIFUNCTIONAL | 23.5 |
| 4 | TETRAFUNCTIONAL | 21.5 |

Another consequence which would be expected if multi-initiation were operational would be that the crosslink density of a cured acrylate film would be increased. Any increase in crosslink density would result in changes in the physical properties of the cured film, such as hardness. To explore this, the hardness of multifunctional photoinitiator-cured films was determined.

EXAMPLE 14

Hardness Testing of Cured Multifunctional Acrylate Mixtures

Mixtures of multifunctional acrylates (80% CN934, 20% TMPTA) containing 2%, by weight, of each of the following photoinitiators: Darocure 2959; photoinitiator "X";- Example A (monofunctional); Example 1 (difunctional); and Example 4 (tetrafunctional); were coated onto glass plates with a No.5 K-Bar. The films were cured by passing them through a Minicure UV rig at 50 ft min$^{-1}$. The films were allowed to stand overnight before their hardnesses were determined with a Sheen pendulum hardness tester.

| Photoinitiator | Hardness (No. of swings on sample/ No. of swings on glass × 100) |
|---|---|
| Darocure 2959 | 11.67 |
| Photoinitiator "X" | 16.67 |
| Example A | 16.67 |
| Example 1 | 19.17 |
| Example 4 | 21.67 |

From the results, it is clear that, as the functionality of the photoinitiator increases, the hardness of the film also increases. This is indicative of increased crosslinking in the cured acrylate film. This supports the notion that multi-initiation is possible from the higher functional multifunctional photoinitiators.

EXAMPLE 15

Assessment of the Amount of Extractable Material from Cured Acrylate Films Using the Novel Compounds as Photoinitiators Acrylate mixtures (80% CN934 and 20% TMPTA) containing 2% of each photoinitiator were coated onto glass plates with a No.5 K-Bar and passed through a Minicure UV rig (1 medium pressure Hg lamp) at 50 ft min$^{-1}$. The cured films were allowed to stand for 24 h before being removed. About 0.40 g of each cured film was then soaked in 5.0 g of THF for 24 h. At the end of this time, the THF solutions were decanted and the film residues dried in a vacuum oven at 25° C. The weight loss due to THF extraction was thus determined.

| Photoinitiator | Photoinitiator functionality | % wt loss |
|---|---|---|
| Darocure 2959[1] | Mono | 20.2 |
| Photoinitiator "X" | Mono (polymerisable) | 9.9 |
| Example A | Mono | 7.5 |
| Example 1 | Di | 6.0 |
| Example 4 | Tetra | 5.5 |
| Example 5 | Hexa | 7.4[2] |

[1]Darocure 2959 (4-(2-hydroxyethoxy)-phenyl-(2-hydroxy)propyl ketone) is the unacrylated version of photoinitiator "X" (4-(2-acryloyloxyethoxy)-phenyl-(2-hydroxy)propyl ketone) and was used as a further control experiment.
[2]The slightly higher level of extractables from the film cured using the hexafunctional photoinitiator is probably due to the lower purity of this product.

Thus, the photoinitiators of the present invention produce cured films with lower levels of extractables.

EXAMPLE 16

Solution Viscosities of the Multifunctional Photoinitiators

To illustrate viscosity advantages of the photoinitiators of the present invention, 10% (w/w) solutions of photoinitiator in the previously described acrylate mixture (80 CN934:20 TMPTA) were prepared and their viscosities recorded at 25° C. on an REL viscometer. For comparison, a 10% solution of Fratelli-Lamberti's KIP 100 ( 100%) was; also prepared. KIP 100 is an oligomeric α-hydroxyalkylphenone with a MW of about 480. The table below shows the viscosity results.

Viscosities of acrylate mixtures containing 10% Photoinitiator

| Photoinitiator | Molecular Weight | Viscosity (Poise) |
|---|---|---|
| Example A | 338 | 88 |
| Example 1 | 644 | 99 |
| Example 4 | 1200 | 121 |
| Example 5 | 1850 | 133 |
| KIP100 | 480 | 153 |

Therefore, it would appear that these multifunctional photoinitiators do not affect the viscosity of an acrylate mixture to the same extent as the more conventional polymeric photoinitiator, KIP100.

In the light of this disclosure, modifications of the described examples, as well as other examples, all within the scope of the present invention as defined by the appended claims, will now become apparent to persons skilled in the art.

What is claimed is:

1. A non-polymeric photoinitiator which is multifunctional with respect to Tape I photoinitiator groups and which is obtainable as the reaction product of a multifunctional core material containing two or more reactive groups and a Type I photoinitiator or a derivative thereof, which photoinitiator or its derivative has a reactive group capable of reacting with said reactive groups of the multifunctional core, wherein one out of the reactive groups of the multi-functional core material and the reactive groups of the photoinitiator or its derivative is selected from either of the groups consisting of (a) and (b) in one of the following sets (i) to (iv) and the other is selected from the other group consisting of (b) and (a) in the same set:

(i) (a) an acid group, acid anhydride group, acid halide group or other carboxylic acid derivative;
  (b) hydroxy groups, amine groups, epoxy groups;
(ii) (a) an acrylate or methacrylate group,
  (b) amine and thiol groups;
(iii) (a) a hydroxy group,
  (b) halide groups and epoxy groups; and
(iv) (a) an amine group,
  (b) halide groups and epoxy groups.

2. The non-polymeric photoinitiator of claim 1, wherein the Type I photoinitiator is an ethylenically unsaturated photoinitiator and the multifunctional core material is a multifunctional amine.

3. The non-polymeric photoinitiator of claim 2, wherein the multifunctional amine is selected from difunctional, tetrafunctional and hexafunctional.

4. The non-polymeric photoinitiator of claim 1, wherein the average percentage molecular weight of functional groups per total molecular weight of the non-polymeric photoinitiator reaction product is at least 30%.

5. The non-polymeric photoinitiator of claim 1, wherein the average percentage molecular weight of functional groups per total molecular weight of the non-polymeric photoinitiator reaction product is at least 40%.

6. The non-polymeric photoinitiator of claim 1, wherein the reaction product is difunctional with respect to Type I photoinitiator groups, and the multifunctional core material has a molecular weight less than 500.

7. The non-polymeric photoinitiator of claim 1, wherein the reaction product is tetrafunctional with respect to Type I photoinitiator groups, and the multifunctional core material has a molecular weight less than 1000.

8. The non-polymeric photoinitiator of claim 1, wherein the reaction product is hexafunctional with respect to Type I photoinitiator groups, and the multifunctional core material has a molecular weight less than 1500.

9. The non-polymeric photoinitiator of claim 1, wherein the Type I photoinitiator is 4-(2-acryloyloxyethoxy)-phenyl-(2-hydroxy-2-propyl) ketone.

10. A liquid composition, curable by exposure to UV radiation, containing:
  (a) a polymerisable component comprising one or more ethylenically unsaturated monomer or oligomers; and
  (b) the photoinitiator component of claim 1.

\* \* \* \* \*